United States Patent [19]

Baliga et al.

[11] Patent Number: 5,635,412
[45] Date of Patent: *Jun. 3, 1997

[54] METHODS OF FABRICATING VOLTAGE BREAKDOWN RESISTANT MONOCRYSTALLINE SILICON CARBIDE SEMICONDUCTOR DEVICES

[75] Inventors: Bantval J. Baliga; Dev Alok, both of Raleigh, N.C.

[73] Assignee: North Carolina State University, Raleigh, N.C.

[ * ] Notice: The term of this patent shall not extend beyond the expiration date of Pat. No. 5,459,089.

[21] Appl. No.: 467,174

[22] Filed: Jun. 6, 1995

Related U.S. Application Data

[62] Division of Ser. No. 238,228, May 4, 1994, Pat. No. 5,449,925.

[51] Int. Cl.$^6$ .................................................. H01L 21/266
[52] U.S. Cl. ........................ 438/520; 438/571; 438/572; 438/523; 438/931
[58] Field of Search ........................... 437/24, 39, 100, 437/101; 148/DIG. 1, DIG. 126, DIG. 148

[56] References Cited

U.S. PATENT DOCUMENTS

| | | | |
|---|---|---|---|
| 3,663,308 | 5/1972 | Davey | 437/24 |
| 3,897,273 | 7/1975 | Marsh et al. | 437/39 |
| 4,071,945 | 2/1978 | Karatsjuka et al. | 437/24 |
| 5,030,580 | 7/1991 | Furukawa et al. | 437/24 |
| 5,135,885 | 8/1992 | Furukawa et al. | 437/100 |
| 5,270,244 | 12/1993 | Baliga | 437/67 |
| 5,399,883 | 3/1995 | Baliga | 257/57 |
| 5,419,783 | 5/1995 | Noguchi et al. | 437/100 |
| 5,459,089 | 10/1995 | Baliga | 437/100 |

FOREIGN PATENT DOCUMENTS 2 021 316  11/1979  United Kingdom.

OTHER PUBLICATIONS

Shimamoto et al., *Improvement of Breakdown Voltage Characteristics of GaAs Junction by Damage-Creation of Ion-Implantation*, Institute of Physics Conference Series, No. 120, Chapter 4, pp. 199–202, 1992.

Bhatnagar et al., *Edge Terminations of SiC High Voltage Schottky Rectifiers*, International Symposium on Power Semiconductor Devices, 1993 Proceedings, Abstract 4.2, pp. 89–94, 1993.

*Primary Examiner*—Chandra Chaudhari
*Attorney, Agent, or Firm*—Bell, Seltzer, Park & Gibson

[57] ABSTRACT

Voltage breakdown resistant monocrystalline silicon carbide semiconductor devices are obtained by forming an amorphous silicon carbide termination region in a monocrystalline silicon carbide substrate, at a face thereof, adjacent and surrounding a silicon carbide device. The amorphous termination region is preferably formed by implanting electrically inactive ions, such as argon, into the substrate face at sufficient energy and dose to amorphize the substrate face. The device contact or contacts act as an implantation mask to provide a self-aligned termination region for the device. The terminated devices may exhibit voltage breakdown resistance which approaches the ideal value for silicon carbide.

21 Claims, 4 Drawing Sheets

METHODS OF FABRICATING VOLTAGE BREAKDOWN RESISTANT MONOCRYSTALLINE SILICON CARBIDE SEMICONDUCTOR DEVICES

This application is a divisional of application Ser. No. 08/238,228, now U.S. Pat. No. 5,449,925 filed May 4, 1994.

FIELD OF THE INVENTION

This invention relates to silicon carbide semiconductor devices and more particularly to silicon carbide power semiconductor devices.

BACKGROUND OF THE INVENTION

Power devices are widely used to carry large currents and support high voltages. Since the early 1950's, developers of electronic power systems began to base their power systems on semiconductor devices. Presently, many types of power semiconductor devices are available, including but not limited to power rectifiers, power bipolar transistors, power field effect transistors, power bipolar/field effect devices, power thyristors and other two, three or more terminal semiconductor devices.

Most power semiconductor devices being marketed today are fabricated in monocrystalline silicon. However, as is known to those skilled in the art, monocrystalline silicon carbide is particularly well suited for use in semiconductor devices, and in particular for power semiconductor devices. Silicon carbide has a wide bandgap, a high melting point, a low dielectric constant, a high breakdown field strength, a high thermal conductivity and a high saturation electron drift velocity compared to silicon. These characteristics would allow silicon carbide power devices to operate at higher temperatures, higher power levels, with lower specific on-resistance than conventional silicon based power devices. A theoretical analysis of the superiority of silicon carbide devices over silicon devices is found in a publication by Bhatnagar and coinventor Baliga entitled *Comparison of 6H—SiC, 3C—SiC and Si for Power Devices*, IEEE Transactions on Electron Devices Transactions, Vol. 40, pp. 645-655, 1993.

In order to take advantage of silicon carbide's higher breakdown field strength, it is important to create device edge terminations having breakdown voltages which approach the ideal parallel plane breakdown voltage. In particular, as is well known to those having skill in the art, for practical power devices, it is necessary to consider edge effects to obtain a realistic design. Edge termination limits the breakdown voltage of practical devices to below the theoretical limits set by semi-infinite device analysis. If a device is poorly terminated, its breakdown voltage can be as low as 10–20% of the theoretical case. This severe degradation in breakdown voltage can seriously compromise device design and lead to reduced current ratings as well. Accordingly, effort has been focused on the proper termination of the device region of power semiconductor devices.

Termination schemes for devices fabricated in a particular semiconductor material often cannot be used to terminate devices formed in another . semiconductor material. For example, in silicon, many power device edge terminations have been proposed. These power device edge terminations are described in detail in a textbook entitled *Modern Power Devices* by coinventor Baliga, published by John Wiley & Sons, 1987, at pp. 79–129. As described, terminations based upon planar diffusion are most commonly used for lower and medium power devices due to their process convenience. Unfortunately, these terminations are difficult to fabricate in silicon carbide due to the difficulty of forming P-N junctions in silicon carbide by conventional ion implantation and diffusion methods. Another well known silicon device termination technique physically changes the device edge by forming a beveled edge or a mesa edge. Again, however, it may be difficult to form these geometric features in silicon carbide due to the difficulty in etching silicon carbide and of removing the damage caused by the etching process.

A technique for improving breakdown voltage of gallium arsenide junctions is described in a publication by Shimamoto et al. entitled *Improvement of Breakdown Voltage Characteristics of GaAs Junction by Damage-Creation of Ion-Implantation*, published in the Institute of Physics Conference Series, No. 120, Chapter 4, pp. 199–202, 1992. There, ion implantation is performed around a junction edge to create implantation damage. An appropriate annealing step is then performed.

Several techniques for terminating silicon carbide devices have also been proposed. For example, floating metal field plate termination was found to improve the breakdown voltage from 210 volts to 400 volts and resistive field plate termination was found to improve the breakdown voltage to 500 volts in an article by Bhatnagar et al. entitled *Edge Terminations for High Voltage SiC Schottky Barrier Rectifiers*, published in the International Symposium on Power Semiconductor Devices, 1993 Proceedings, Abstract 4.2, pp. 89–94, 1993. Since the ideal parallel plate breakdown voltage for silicon carbide is about 900 volts, these edge termination techniques produce a breakdown voltage of about 60% of the ideal value. Floating field ring and floating field plate terminations for silicon carbide power MOSFETs are also described in U.S. Pat. No. 5,233,215 to coinventor Baliga.

In view of the above, there is a continuing need for device terminations and fabrication methods which are uniquely suitable for silicon carbide and which allow device breakdown voltage to approach the ideal value.

SUMMARY OF THE INVENTION

It is therefore an object of the invention to provide improved silicon carbide power devices.

It is another object of the present invention to provide improved termination for silicon carbide power devices.

It is still another object of the present invention to provide edge terminations for silicon carbide power devices which can be fabricated using conventional silicon carbide processing steps.

These and other objects are provided according to the present invention by an amorphous silicon carbide region in a monocrystalline silicon carbide substrate, at a face thereof, adjacent and surrounding a silicon carbide power device at the face of the monocrystalline silicon carbide substrate. The amorphous silicon carbide region is preferably formed by implanting ions at an energy and dose which forms an amorphous region at the face of the silicon carbide substrate, surrounding the silicon carbide device. While not wishing to be bound by any theory, it is believed that, due to the large energy bandgap for silicon carbide, the amorphous layer will have a high resistivity which will distribute the voltage along the substrate face. The improved voltage distribution along the substrate face reduces the electric field at the edge of the device and thereby improves the breakdown voltage.

In particular, according to the present invention, a silicon carbide semiconductor device includes a monocrystalline silicon carbide substrate and a silicon carbide device in the monocrystalline silicon carbide substrate, extending to a face thereof. An amorphous silicon carbide region is formed in the monocrystalline silicon carbide substrate, at the face, adjacent and surrounding the silicon carbide device at the face. When the silicon carbide device includes a contact region on the face of the monocrystalline silicon carbide substrate, the amorphous region is preferably formed at the face adjacent and surrounding the contact region. The amorphous silicon carbide region preferably includes electrically inactive ions therein. For example, argon ions may be contained therein.

The above described edge termination region for monocrystalline silicon carbide devices is preferably formed by amorphizing a face of a monocrystalline silicon carbide substrate adjacent and surrounding a silicon carbide semiconductor device. Amorphizing preferably takes place by directing electrically inactive ions to the face adjacent the silicon carbide semiconductor device. The termination region may be self-aligned to the silicon carbide device by using the contact or contacts for the silicon carbide device as a mask for ion implantation.

For example, in forming a breakdown resistant silicon carbide Schottky barrier rectifier, a Schottky contact may be formed on a face of a monocrystalline silicon carbide substrate. Argon ions are then implanted into the face of the silicon carbide substrate, preferably at an energy of about 30 keV and at a dose of at least $10^{15}/cm^2$ to thereby form a thin amorphous silicon carbide region surrounding the Schottky contact. The Schottky contact is preferably sufficiently thick to block the argon ions from penetrating into the silicon carbide substrate below the contact. After implantation, the silicon carbide substrate is not annealed, so that the amorphorized region remains amorphous and the implantation damage is not repaired.

Silicon carbide semiconductor devices according to the invention possess high breakdown voltages approaching that of an ideal device and may be fabricated using conventional ion implantation steps for silicon carbide. High performance devices are thereby obtained.

DETAILED DESCRIPTION OF PREFERRED EMBODIMENTS

Figure 1A:
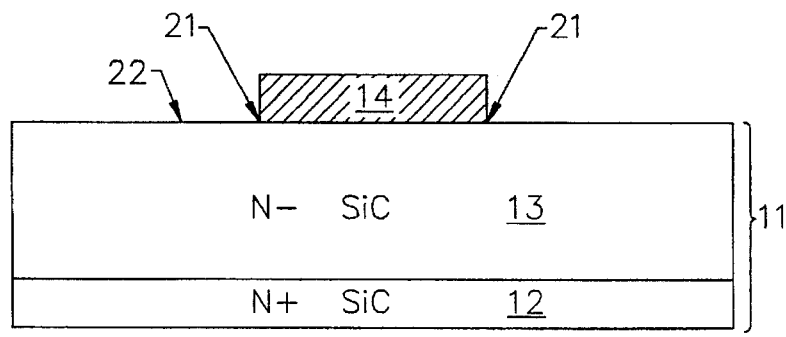
FIGS. 1A–1D illustrate cross-sectional views of a silicon carbide Schottky barrier rectifier according to the present invention during intermediate fabrication steps.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Referring now to FIGS. 1A–1D, fabrication of a high voltage, breakdown resistant, monocrystalline silicon carbide semiconductor device according to the present invention is illustrated. In particular, FIGS. 1A–1D illustrate the fabrication of a breakdown resistant Schottky barrier rectifier. However, it will be understood by those having skill in the art that the present invention can be utilized to produce voltage resistant edge termination regions for any silicon carbide power device.

Referring now to FIG. 1A, a monocrystalline silicon carbide substrate 11 includes a first portion 12 which is relatively heavily doped, shown by N+ in FIG. 1A. A second, relatively lightly doped portion 13 is indicated by N– in FIG. 1A. Region 13 is typically referred to as the "drift" region. A Schottky barrier contact 14 for example titanium, is formed on face 22 of silicon carbide substrate 11. Since FIG. 1A illustrates a Schottky barrier rectifier, the edge of Schottky barrier contact 14 defines the edge 21 of the silicon carbide device. It will be understood by those having skill in the art that for other devices such as power field effect transistors, the device edge will typically surround a plurality of contacts. The design and fabrication of silicon carbide Schottky barrier rectifiers and other silicon carbide power devices are well known to those having skill in the art and need not be described further herein.

Figure 1B:
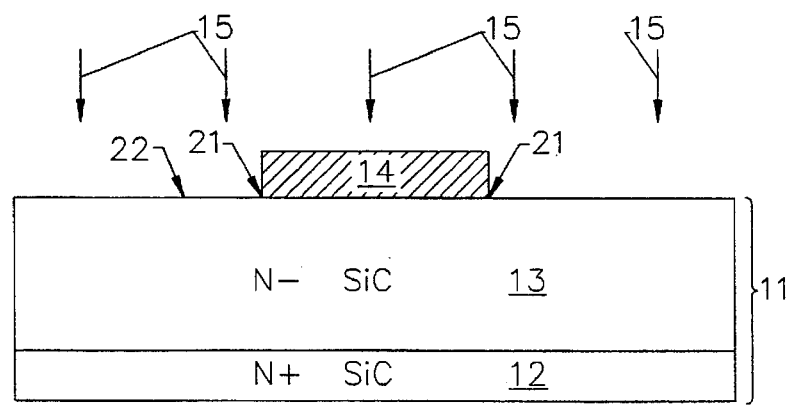
Figure 1C:
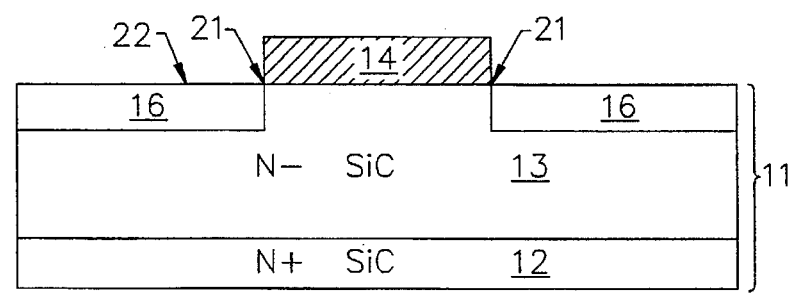

Referring now to FIG. 1B, electrically inactive ions 15 are directed to face 22 of silicon carbide substrate. Preferably, the thickness and/or other characteristics of contact 14 are chosen so that contact 14 blocks ions 15 and prevents the ions from penetrating into the silicon carbide substrate 11 beneath the contact. As shown in FIGS. 1C, ions 15 penetrate silicon carbide substrate 11 at face 22, adjacent and surrounding contact 14 to form an amorphous silicon carbide termination region 16. The dose and energy of ions 15 are selected so that ions 15 amorphize silicon carbide substrate 11 at face 22 upon implantation therein. Implantation of ions into a silicon carbide substrate to create an amorphous region therein is described in U.S. Pat. No. 5,270,244 to coinventor Baliga, the disclosure of which is hereby incorporated herein by reference. Multiple implants at different energies may also be used in order to obtain an amorphous region having the desired depth. Carbon, helium, silicon, hydrogen, neon and other ions may be used. The implant or implants are not followed by an annealing step, so that the amorphized region 16 remains amorphous.

Figure 1D:
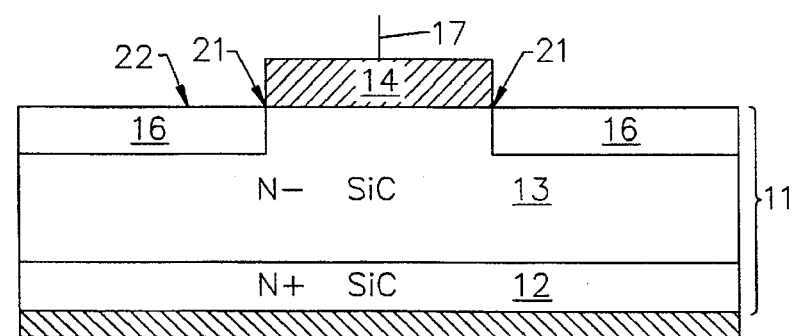

Finally, referring to FIG. 1D, Schottky barrier rectifier 10 is completed by forming an ohmic contact 18 adjacent first substrate portion 12 and by forming anode electrode 17 and cathode electrode 19 to electrically contact Schottky barrier contact 14 and ohmic contact 18, respectively.

Figure 2A:
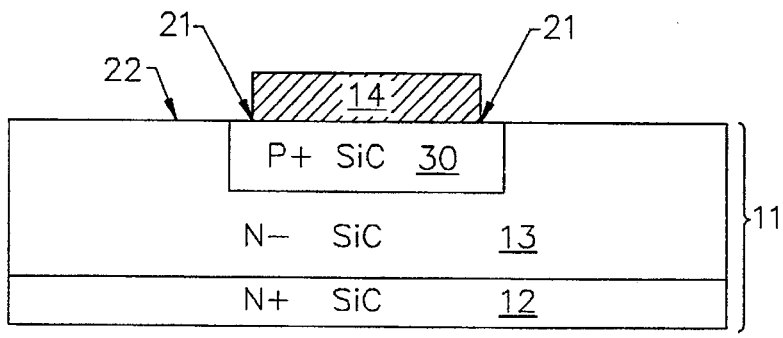
FIGS. 2A–2D illustrate cross-sectional views of a silicon carbide P-N junction rectifier according to the present invention during intermediate fabrication steps.
Figure 2B:
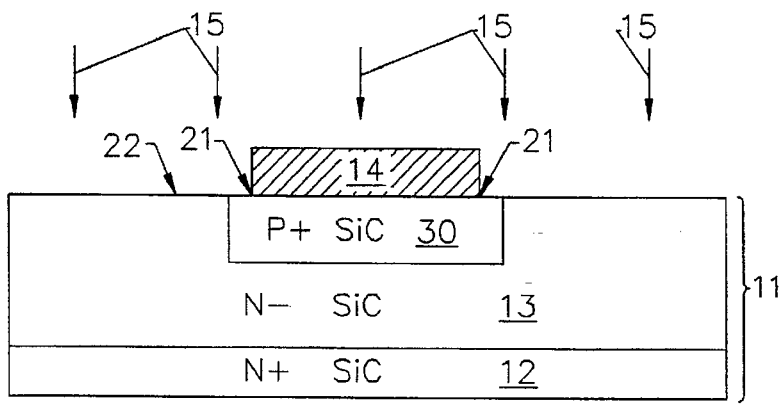
Figure 2C:
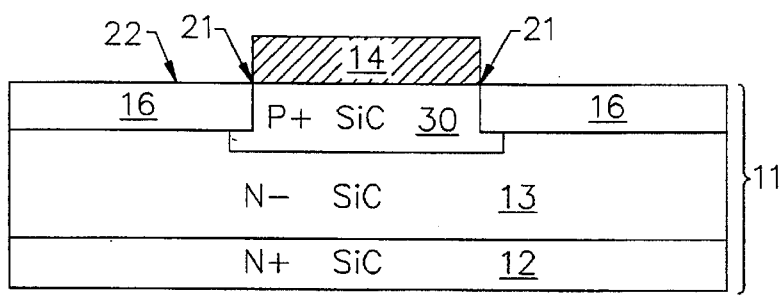
Figure 2D:
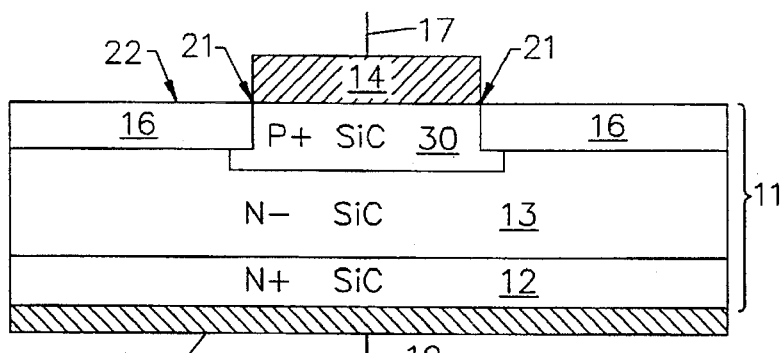

FIGS. 2A–2D illustrate the fabrication of a breakdown resistant P-N junction rectifier, according to the present invention. As illustrated in FIG. 2A, P-N junction rectifier includes a P+ silicon carbide region 30 at face 22. P+ region 30 may be formed using diffusion or implantation. A particularly useful method for forming a P-N junction in silicon carbide is described in application Ser. No. 08/008,203, filed Jan. 25, 1993, by the present inventors and Bhatnagar entitled Method for Forming a P-N Junction in Silicon Carbide, now U.S. Pat. No. 5,318,915, issued Jun. 7, 1994, the disclosure of which is incorporated herein by reference. In FIG. 2A, contact 14 forms an ohmic contact with P+ silicon carbide region 30. Titanium may be used to form an ohmic contact to region 30. The remaining processing of FIGS. 2A–2D is identical to that described in FIGS. 1A–1D and will not be described in detail again.

EXAMPLE

In order to demonstrate the effectiveness of an amorphous silicon carbide edge termination region according to the present invention, the performance of terminated and unterminated titanium Schottky barrier diodes was compared. Titanium Schottky barrier diodes were fabricated on N-type 6H—SiC epitaxial layers 13 with a doping of $2\times10^{16} cm^{-3}$ and thickness of 10 μm deposited on heavily doped N-type 6H-silicon carbide substrates 12. Prior to fabrication of the Schottky barrier diodes, the silicon carbide wafer was given a Huang clean. Circular Schottky barrier diodes (300 μm diameter) were fabricated using a shadow mask with sequential evaporation of Ti (2000Å) and Al (10,000Å) to form layer 14. A Ti/Al-layer was also blanket evaporated on the heavily doped substrate to form a large area backside ohmic contact 18.

After the metallization, the four quadrants of the wafer were subjected to different does of argon implantation 15. In quadrant 1, no implantation was performed. The diodes in this quadrant are referred to as "unterminated" diodes. In quadrants 2, 3 and 4, the implant dose was $1\times10^2$ cm$^{-2}$, $3.1\times10^{13}$ cm$^{-2}$, and $1\times10^{15}$ cm$^{-2}$, respectively. The implant energy in all the cases was about 30 keV. The implant energy was chosen so that the ions were completely stopped by the Ti/Al metal layer 14 to avoid any degradation of the on-state characteristics of the Schottky barrier diodes.

The characteristics of the Schottky barrier diodes were evaluated in both the forward and reverse bias directions. Current-voltage (IV) measurements were made using a Keithley model 251 IV test system. Prior to IV measurements, the doping concentration of the N-type epilayer 13 was measured experimentally using capacitance voltage (CV) analysis. The doping concentration of the N-type epitaxial layer 13 was found to vary between $1.9\times10^{16}$ cm$^{-3}$ and $2.1\times10^{16}$ cm$^{-3}$, with an average value of $2\times10^6$ cm$^{-3}$. The ideal plane parallel breakdown voltage corresponding to this range of epitaxial layer doping is 950–1020V. The calculation of ideal plane parallel breakdown voltage was based upon published breakdown voltages for mesa terminated devices.

Figure 3:
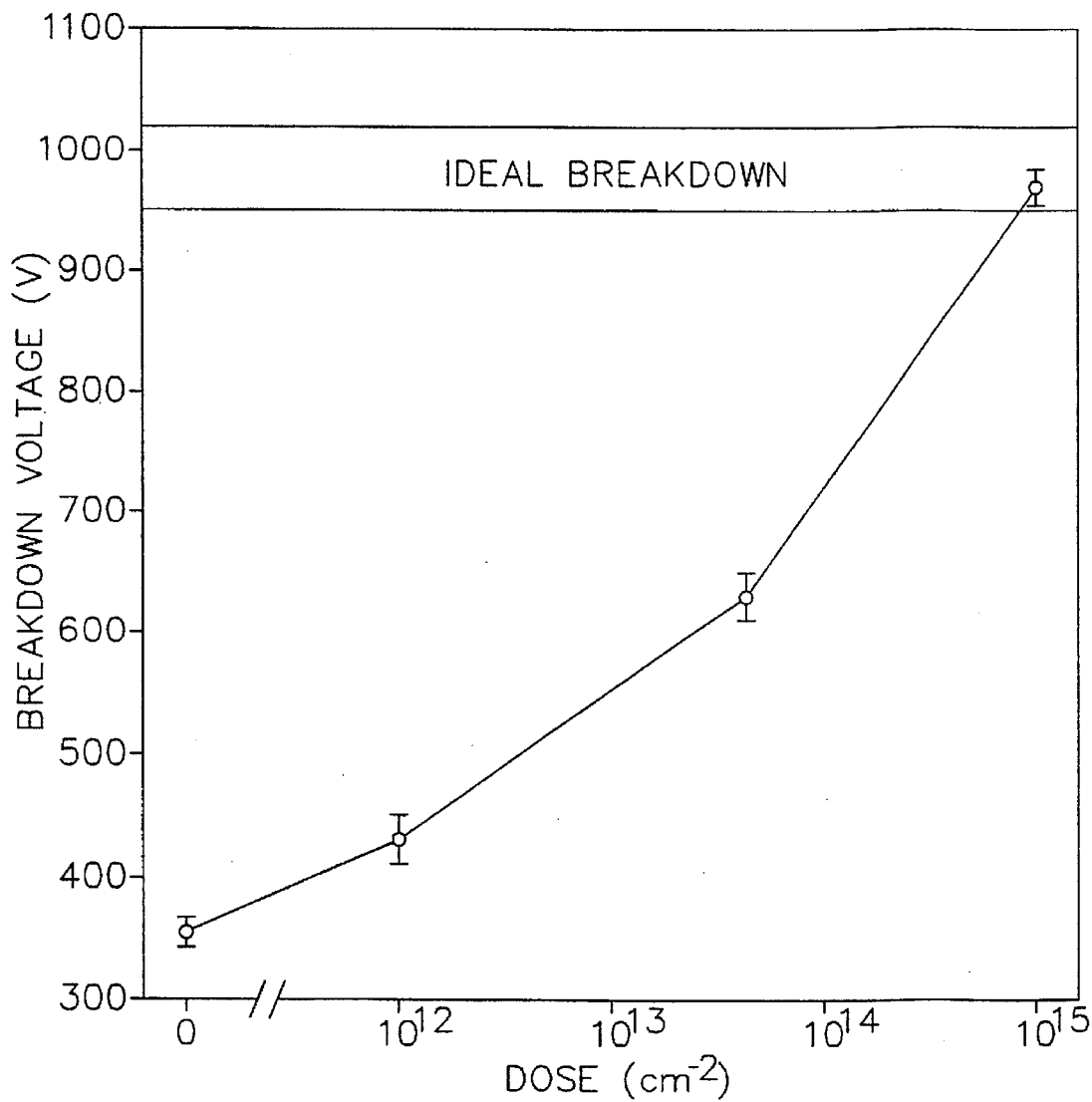
FIG. 3 graphically illustrates implant dose of argon atoms versus normalized breakdown voltage according to the present invention.

To study the effect of the termination on the breakdown voltage of these Schottky barrier diodes, reverse IV measurements were performed. The breakdown voltages were measured for multiple diodes in each quadrant. The breakdown voltage progressively improved with increase in the implant dosage. The unterminated Schottky barrier diodes had the smallest breakdown voltage (358±11V). The breakdown voltage increased with dose as shown in FIG. 3. Ideal breakdown voltage is shown as a band because of doping variation. As illustrated, in quadrant 4, ideal plane parallel breakdown voltages have been achieved.

As also shown, argon doses above $10^{14}$/cm$^2$ produce breakdown voltages which are at least 65% of the ideal voltage. This dosage is far greater than reported dosages for ion implantation in gallium arsenide devices in the aforementioned Shimamoto publication, wherein the highest breakdown voltage after ion implantation in gallium arsenide was obtained for a dose of $5\times10^{12}$/cm$^2$. At a dose of $5\times10^{13}$/cm$^2$, the breakdown voltage was found to reduce to that without the ion implantation. These doses are below the values required for the formation of an amorphous layer. Moreover, it was reported in the Shimamoto publication that the diodes must be annealed at between 300°–500° C. in order to obtain low leakage current with sharp breakdown. This additional processing is detrimental to preserving a good Schottky barrier interface in silicon carbide.

Figure 4:
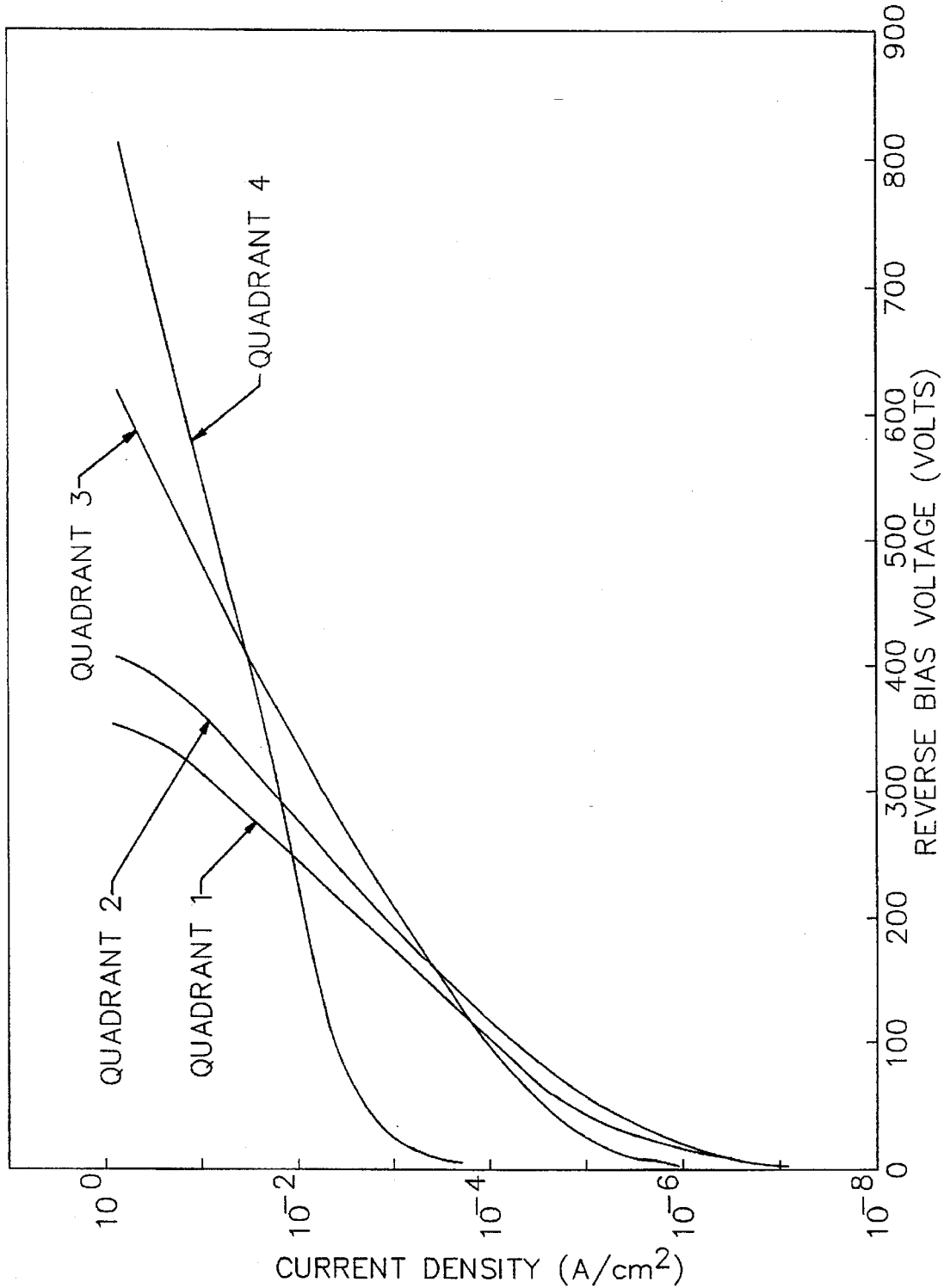
FIG. 4 graphically illustrates leakage current as a function of reverse bias voltage according to the present invention.

FIG. 4 shows the IV curves for the four quadrants in reverse bias. At high reverse bias voltages, the leakage current of the terminated Schottky barrier diodes was less than that of the unterminated Schottky barrier diodes. However, at small reverse bias voltages, the leakage current of the unterminated Schottky barrier diodes was less than that of the terminated Schottky barrier diodes. Forward IV measurements were also made on the four quadrants. The IV characteristics were found to be same for all the quadrants, indicating that the implant had no effect on the on-state characteristics of the diodes.

The dimensions of amorphous silicon carbide termination region 16 will typically vary as a function, among other things, of the silicon carbide device type, dimensions, doping levels and operating parameters. In general, as the breakdown voltage of a device increases, the width of the termination region will also increase. The termination region will also generally be significantly wider than the depletion width in the device. For example, for 1000 V devices, termination widths on the order of 100 μm may be expected, while the depletion width is less than 10 μm.

An amorphous silicon carbide termination region is illustrated in a silicon carbide lateral MESFET in copending application Serial No. 08/237,787 to coinventor Baliga, entitled High Voltage Silicon Carbide MESFETs and Methods of Fabricating Same, now U.S. Pat. No. 5,399,883, the disclosure of which is hereby incorporated herein by reference. In conclusion, an amorphous silicon carbide termination region allows the breakdown characteristics of a silicon carbide semiconductor device to approach ideal values without significantly adding process complexity and without significantly altering other desirable device characteristics. The amorphous silicon carbide termination region is believed to create a thin, high resistivity layer at the surface, beyond the device edge. This layer promotes the spreading of the potential along the surface which results in reduced edge electric field.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming a breakdown resistant silicon carbide semiconductor device, comprising the steps of:

forming a silicon carbide semiconductor device in a monocrystalline silicon carbide substrate, extending to a face thereof; and amorphizing said monocrystalline silicon carbide substrate, at said face, adjacent and surrounding said silicon carbide semiconductor device.

2. A method according to claim 1 wherein said amorphizing step comprises the step of:

implanting electrically inactive ions into said face, adjacent said silicon carbide semiconductor device, at an energy and dose which is sufficient to amorphize said monocrystalline silicon carbide substrate at said face.

3. A method according to claim 2 wherein said ion implanting step comprises the step of implanting argon ions into said face, adjacent said silicon carbide semiconductor device, at an energy of at least about 30 keV and a dose of at least about $10^{15}$/cm$^2$.

4. A method according to claim 1 wherein said amorphizing step is not followed by the step of annealing the monocrystalline Silicon carbide substrate.

5. A method of forming a breakdown resistant silicon carbide Schottky barrier rectifier, comprising the steps of:

forming a Schottky contact on a face of a monocrystalline silicon carbide substrate, such that said Schottky contact and said silicon carbide substrate form a Schottky barrier therebetween; and implanting argon ions into said face of said monocrystalline silicon carbide substrate, at an energy of about 30 keV and at a dose of at least $10^{15}/cm^2$, to thereby form an amorphous silicon carbide region surrounding said Schottky contact.

6. A method according to claim 5 wherein said implanting step is not followed by the step of annealing the monocrystalline silicon carbide substrate.

7. A method of forming a breakdown resistant silicon carbide rectifier, comprising the steps of:

forming a monocrystalline silicon carbide region of second conductivity type in a monocrystalline silicon carbide substrate of first conductivity type, said monocrystalline silicon carbide region extending to a face of said monocrystalline silicon carbide substrate;

forming an ohmic contact on said monocrystalline silicon carbide region, at said face; and implanting argon ions into said face of said monocrystalline silicon carbide substrate, at an energy of about 30 keV and at a dose of at least $10^{15}/cm^2$, to thereby form an amorphous silicon carbide region surrounding said ohmic contact.

8. A method according to claim 7 wherein said implanting step is not followed by the step of annealing the monocrystalline silicon carbide substrate.

9. A method of forming a breakdown resistant contact for a silicon carbide semiconductor device, comprising the steps of:

forming a contact region on a face of a monocrystalline silicon carbide substrate, said contact region being sufficiently thick to block implanted ions from entering said silicon carbide substrate therethrough; and implanting electrically inactive ions into said face at a dose and at an energy which is sufficient to amorphize said face surrounding said contact region, to thereby form an amorphous silicon carbide region at said face, adjacent and surrounding said contact region.

10. A method according to claim 9 wherein said ion implanting step comprises the step of implanting argon ions into said face at an energy of about 30 keV and a dose of at least about $10^{15}/cm^2$.

11. A method according to claim 9 wherein said implanting step is not followed by the step of annealing the monocrystalline silicon carbide substrate.

12. A method of forming a breakdown resistant silicon carbide Schottky barrier rectifier, comprising the steps of:

forming a Schottky contact on a face of a monocrystalline silicon carbide substrate, so that the Schottky contact and the silicon carbide substrate form a Schottky rectifier therebetween; and implanting ions, which are electrically inactive in silicon carbide, into the face at a dose and energy level sufficient to form an amorphous silicon carbide region which at least substantially surrounds the Schottky contact.

13. The method of claim 12, wherein said implanting step comprises implanting ions into the face using the Schottky contact as an implant mask.

14. The method of claim 13, wherein the silicon carbide substrate contains an N-type region therein extending to the face; and wherein said forming step comprises forming a Schottky contact on the N-type region at the face.

15. The method of claim 14, wherein said implanting step comprises implanting argon ions at a dose of at least about $10^{15}/cm^2$ and at an energy of about 30 keV.

16. The method of claim 14, wherein said implanting step is not followed by the step of annealing the amorphous silicon carbide region.

17. A method of forming a breakdown resistant silicon carbide P-N rectifying junction, comprising the steps of:

forming a monocrystalline silicon carbide region of second conductivity type in a silicon carbide substrate of first conductivity type, at a face thereof, to thereby define a P-N junction;

forming an ohmic contact on the monocrystalline silicon carbide region of second conductivity type, at the face;

implanting ions, which are electrically inactive in silicon carbide, into the face at a dose and energy level sufficient to form an amorphous silicon carbide region which at least substantially surrounds the ohmic contact.

18. The method of claim 17, wherein said implanting step comprises implanting ions into the face using the ohmic contact as an implant.

19. The method of claim 18, wherein said implanting step comprises implanting ions into the monocrystalline silicon carbide region of second conductivity type and into the silicon carbide substrate of first conductivity type, at the P-N junction therebetween.

20. The method of claim 19, wherein said implanting step comprises implanting argon ions at a dose of at least about $10^{15}/cm^2$ and at an energy of about 30 keV.

21. The method of claim 19, wherein said implanting step is not followed by the step of annealing the amorphous silicon carbide region.

* * * * *